US008498471B2

(12) United States Patent  
Chen et al.

(10) Patent No.: US 8,498,471 B2
(45) Date of Patent: Jul. 30, 2013

(54) METHOD FOR IDENTIFYING A WAFER SERIAL NUMBER

(75) Inventors: Wei-Chin Chen, Taipei County (TW); Chien-Ming Li, Taoyuan (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 672 days.

(21) Appl. No.: 12/757,044

(22) Filed: Apr. 9, 2010

(65) Prior Publication Data

US 2011/0123136 A1 May 26, 2011

(30) Foreign Application Priority Data

Nov. 23, 2009 (TW) .............................. 98139764 A (51) Int. Cl.
*G06K 9/00* (2006.01)
(52) U.S. Cl.
USPC .......................................... 382/147; 382/145
(58) Field of Classification Search
None
See application file for complete search history.

(56) References Cited

U.S. PATENT DOCUMENTS

| 5,023,424 | A | 6/1991 | Vaught |
| 5,742,702 | A * | 4/1998 | Oki ................................ 382/156 |
| 6,665,429 | B1 * | 12/2003 | Wang ............................. 382/128 |
| 7,106,896 | B2 | 9/2006 | Suzuki |
| 2004/0141645 | A1 * | 7/2004 | Lee et al. ....................... 382/182 |
| 2009/0080761 | A1 | 3/2009 | Barker |

FOREIGN PATENT DOCUMENTS

| TW | I264077 | 10/2006 |
| TW | I310223 | 5/2009 |

* cited by examiner

Primary Examiner — Gregory J Toatley
Assistant Examiner — Juan D Valentin, II
(74) Attorney, Agent, or Firm — Winston Hsu; Scott Margo (57) ABSTRACT

A method of identifying a wafer serial number is provided. First, a wafer having a wafer serial number is provided. Second, an identification procedure is carried out to identify the wafer serial number by means of multiple identification recipes thereby obtaining multiple digit results which correspond to the multiple identification recipes and a specific digit in the wafer serial number. The multiple digit results include at least two of a successful result and an unsuccessful result. Then, the wafer serial number is determined in accordance with the multiple digit results.

17 Claims, 8 Drawing Sheets

| 210 | 211 | 212 | 213 | 214 | 215 | 216 | 217 | 218 |
|---|---|---|---|---|---|---|---|---|
| 220 | 221 | 222 | 223 | 224 | 225 | 226 | 227 | 228 |
| 220 δ | 1 | ? | ? | 0 | ? | K | ? | ? |
| 121 ε | ? | 1 | 5 | ? | ? | ? | A | ? |
| 121 ζ | ? | 1 | ? | 0 | ? | ? | ? | 1 |
| 121 η | ? | ? | 5 | ? | F | ? | A | ? |

| 110 | 111 | 112 | 113 | 114 | 115 | 116 | 117 |
|-----|-----|-----|-----|-----|-----|-----|-----|
| 120 | 121 $\alpha$ | 122 $\alpha$ | 123 $\alpha$ | 124 $\alpha$ | 125 $\alpha$ | 126 $\alpha$ | 127 $\alpha$ |
|  | ? | ? | ? | ? | K | ? | 6 |

FIG. 3

| 110 | 111 | 112 | 113 | 114 | 115 | 116 | 117 |
|-----|-----|-----|-----|-----|-----|-----|-----|
| 121α | ? | ? | ? | ? | K | ? | 6 |
| 121β | ? | 0 | ? | F | ? | ? | ? |

FIG. 4

| 110 | 111 | 112 | 113 | 114 | 115 | 116 | 117 |
|---|---|---|---|---|---|---|---|
| 121 $\alpha$ | ? | ? | ? | ? | K | ? | 6 |
| 121 $\beta$ | ? | 0 | ? | F | ? | ? | ? |
| 121 $\gamma$ | 3 | ? | 8 | ? | ? | F | ? |

| 210 | 211 | 212 | 213 | 214 | 215 | 216 | 217 | 218 |
|---|---|---|---|---|---|---|---|---|
| 220 | 221 | 222 | 223 | 224 | 225 | 226 | 227 | 228 |
| 220 $\delta$ | 1 | ? | ? | 0 | ? | K | ? | ? |
| 121 $\varepsilon$ | ? | 1 | 5 | ? | ? | ? | A | ? |
| 121 $\varsigma$ | ? | 1 | ? | 0 | ? | ? | ? | 1 |
| 121 $\eta$ | ? | ? | 5 | ? | F | ? | A | ? |

FIG. 7

| Digit | Representative value |
|---|---|
| - | 13 |
| (Note 1) | 14 |
| 0 | 16 |
| 1 | 17 |
| 2 | 18 |
| 3 | 19 |
| 4 | 20 |
| 5 | 21 |
| 6 | 22 |
| 7 | 23 |
| 8 | 24 |
| 9 | 25 |
| A | 33 |
| B | 34 |
| C | 35 |
| D | 36 |
| E | 37 |
| F | 38 |
| G | 39 |
| H | 40 |
| I | 41 |
| J | 42 |
| K | 43 |
| L | 44 |
| M | 45 |
| N | 46 |
| O | 47 |
| P | 48 |
| Q | 49 |
| R | 50 |
| S | 51 |
| T | 52 |
| U | 53 |
| V | 54 |
| W | 55 |
| X | 56 |
| Y | 57 |
| Z | 58 |

FIG. 8

METHOD FOR IDENTIFYING A WAFER SERIAL NUMBER

BACKGROUND OF THE INVENTION

1. Field of the Invention

The present invention generally relates to a method for identifying a wafer serial number. In particular, the present invention is directed to a method for identifying a wafer serial number by means of accumulating multiple and independent digit results.

2. Description of the Prior Art

In the semiconductor manufacturing process, a wafer always undergoes many procedures, such as lithography, exposure, etching, ion implantation, cleaning, etc. In order to increase the efficiency and the yield, there are multiple wafers together undergoing the same procedure in each single procedure. In order to distinguish each wafer which undergoes the same procedure at the same time, every wafer has a unique number. This unique number is called a "wafer serial number."

A wafer serial number usually includes a plurality of digits. Each digit may be any one of a character such as A, b, Γ or δ, a number from 0-9 or a symbol such as #, % or £. Under the combination of characters, numbers and symbols, every wafer is capable of having a unique number. In order to distinguish each wafer, a step called "wafer serial number identification" is needed. The step, namely the wafer serial number identification step, is usually accomplished by optically reading every digit of the wafer serial number so as to obtain all of the digit results of the wafer serial number of this wafer. However, in the current method for identifying a wafer serial number, a plurality of specific identification recipes are used to identify the digit results of each and every one of the digits in a wafer serial number. Supposing a certain identification recipe may identify all of the digit results of each and every one of the digits in a wafer serial number, a complete wafer serial number can accordingly be obtained.

However, in a practical operation, the outcome is not always so straightforward and simple as expected. Every possible reason, such as scratches or stains, may substantially jeopardize the read rate of any digit in the wafer serial number. If under a certain condition, i.e. an identification recipe, all digit results of the digits in the wafer serial number of a wafer cannot be completely identified, in other words any one of the digits fails to be successfully read under a certain condition during an identification procedure, the identification condition is determined to fail to read and no complete wafer serial number is successfully obtained.

Nevertheless a complete wafer serial number is still required, so another identification condition is used to identify all digit results of the digits in the wafer serial number of a wafer. If under such new identification condition all digit results of the digits in the wafer serial number of a wafer can be identified, a complete wafer serial number is therefore obtained. However, if under such new identification condition not all digit results of the digits in the wafer serial number of a wafer can be identified, that is, any one of the digits fails to be read under this condition, it is still considered a reading failure so still no complete wafer serial number is successfully obtained. At this time, still another identification condition is used to identify all digit results of the digits in the wafer serial number of a wafer till all the digit results of the digits in the wafer serial number of a wafer are successfully identified to obtain a complete wafer serial number.

But, when all of the identification conditions are not able to identify all the digit results of the digits in the wafer serial number, by any means there is no complete wafer serial number can be obtained at all. This is a serious problem because the wafer serial number is abnormally processed and the unknown wafers cannot be distinguished, even worse the manufacturing process and the yield are severely compromised.

As a result, a novel method to identify a wafer serial number is still needed. Such novel method should decrease the possibility of abnormal reading rate of the wafer serial number without substantially changing the current process.

SUMMARY OF THE INVENTION

The present invention accordingly proposes a novel method to identify a wafer serial number. The novel method of the present invention is able to decrease the possibility of abnormal reading rate of the wafer serial number without substantially changing the current process.

The present invention in one aspect proposes a method of identifying a wafer serial number. First, a wafer with a wafer serial number thereon is provided. The wafer serial number includes a plurality of digits. Second, an identification procedure is performed on the wafer to identify the wafer serial number by means of multiple identification recipes, thereby obtaining multiple digit results which correspond to one specific digit in the wafer serial number under the multiple identification recipes. Each digit results may include at least two of a successful result and an unsuccessful result. Later, the wafer serial number is determined in accordance with the multiple digit results. In one embodiment of the present invention, the identification recipes may include at least two of a light angle, a light intensity, a light direction and a light location.

The present invention in another aspect proposes a method of identifying a wafer serial number. First, a wafer with a wafer serial number thereon is provided. Second, an identification procedure is performed on the wafer to identify the wafer serial number by means of multiple identification recipes, thereby obtaining multiple digit results which correspond to one specific digit in the wafer serial number under the multiple identification recipes. The multiple digit results may include at least two of a successful result, a possible result and an unsuccessful result. Later, the wafer serial number is determined in accordance with the multiple digit results.

In one embodiment of the present invention, the method of identifying a wafer serial number of the present invention further includes performing a check procedure to obtain the wafer serial number. The check procedure is initiated only when the multiple digit results of only one single digit are composed of the possible result (s) and the unsuccessful result(s), and the rest of the digits have at least one successful result after the identification procedure is finished. In another embodiment of the present invention, the method of identifying a wafer serial number of the present invention further includes a combination procedure and a check procedure. The combination procedure is initiated to obtain a combination result only when multiple digit results of multiple digits are composed of the possible result (s) and the unsuccessful result(s), and the rest of the digits have at least one successful result after the identification procedure. Then, the check procedure is initiated and repeatedly performed to check the combination results.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a novel reading logic to identify a wafer serial number. The novel reading logic of the present invention is able to dramatically decrease the abnormal reading possibility of the wafer serial number without substantially changing the current process.

Figure 1:
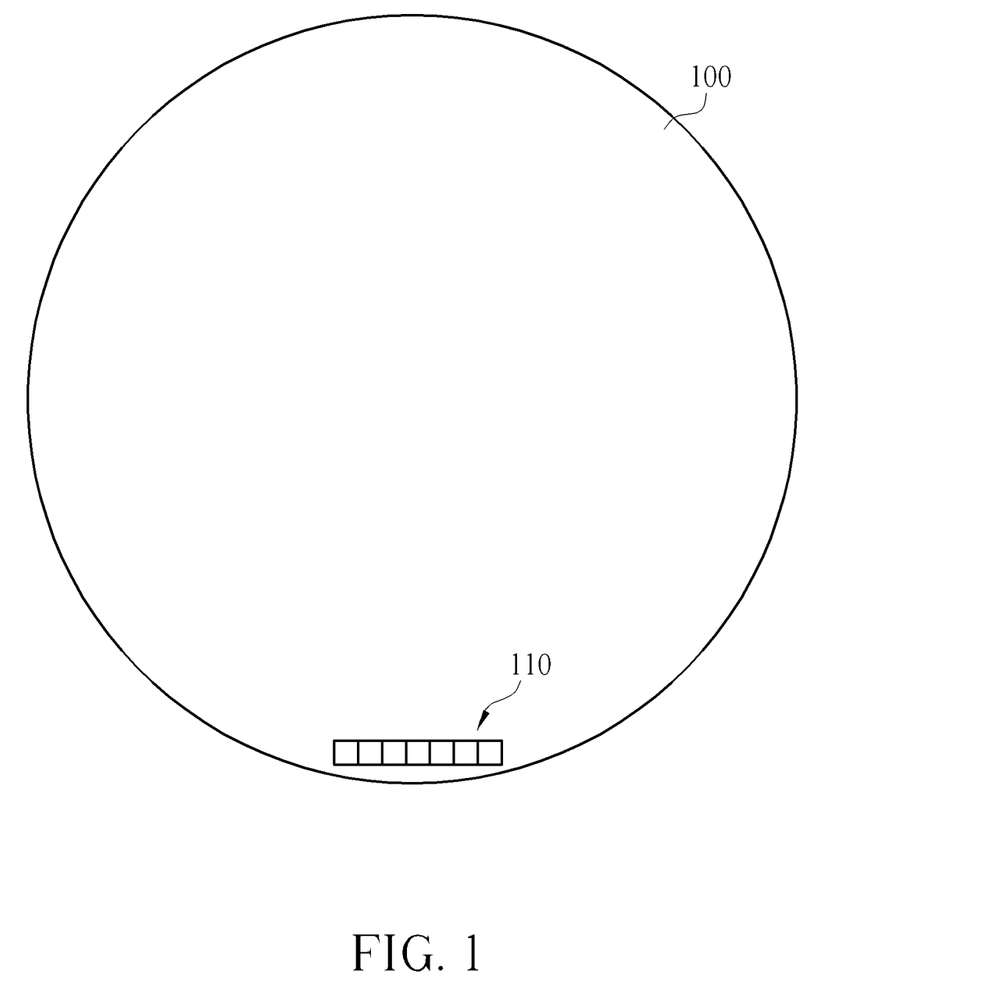
FIGS. 1-5 illustrate an example of the method for identifying a wafer serial number of the present invention.

The present invention in one aspect provides a method for identifying a wafer serial number. FIGS. 1-5 illustrate an example of the method for identifying a wafer serial number of the present invention. First, as shown in FIG. 1, a wafer 100 is provided. There is a wafer serial number 110 on the wafer 100. The wafer 100 may be a wafer 100 in a semiconductor process and is about to undergo various procedures, such as lithography, exposure, etching, cleaning, ion implantation, etc. The wafer serial number 110 is used to mark the wafer 100, like an ID number of a wafer. A wafer serial number 110 usually includes a plurality of digits. For example, a wafer serial number 110 usually includes 7-12 digits. Each digit may independently be anyone of a character such as A, b, Γ or δ, a number from 0-9, a symbol such as #, %, £, a barcode or the combination.

Second, an identification procedure is carried out on the wafer 100. The identification procedure is used to identify every member of the digits in the wafer serial number 110 to determine an unknown wafer. An identification procedure usually includes multiple identification recipes. That is, multiple identification recipes are respectively employed one by one to identify every member of the digits in a given wafer serial number 110. After the identification procedure including multiple identification recipes, multiple digit results 120 corresponding to every member of the digits in the wafer serial number 110 are collectively obtained.

The identification recipes may include various identification parameters, such as a light angle, a light intensity, a light direction, a light location, etc. Desirable identification recipes are formulated by changing and combining the various identification parameters. Usually a complete identification procedure includes 4-10 identification recipes.

Figure 2:
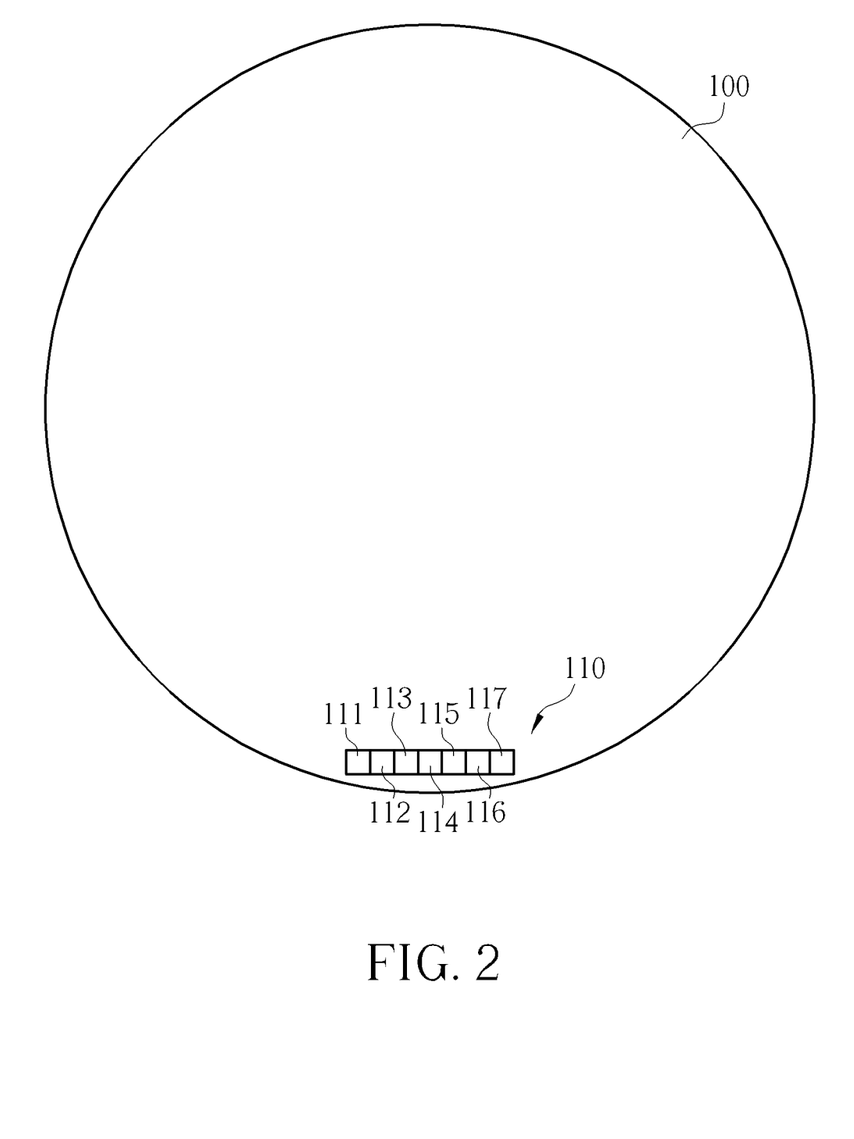

For example, as shown in FIG. 2, assuming the wafer serial number 110 of a certain wafer 100 has 7 digits, i.e. there are 7 members, namely 111, 112, 113, 114, 115, 116 and 117, in the wafer serial number 110. Every identification recipe is used to identify every digit, or called a member 111, 112, 113, 114, 115, 116 and 117, in the wafer serial number 110 to determine an unknown serial number. Due to the intrinsic distinctions of every identification recipe, not every identification recipe may always completely identify every digit in the wafer serial number 110. Normally, each identification recipe identifies some digit or digits in the wafer serial number 110. The information with respect to every digit which is identified by a certain identification recipe in the wafer serial number 110 is called a "digit result" 120.

Generally speaking, a digit result 120 which corresponds to every digit 111, 112, 113, 114, 115, 116 and 117 with respect to a certain identification recipe may be either of two possible results, namely a successful result and an unsuccessful result. Only one single digit result, that is, either a successful result or an unsuccessful result, is obtained for a certain digit, member 111 for example, under a given identification recipe. In general, a read rate is used to judge if a digit result 120 belongs to a successful result or an unsuccessful result.

Under a certain identification recipe, every digit should acquire a corresponding result. In other words, under any identification recipe, every digit 111, 112, 113, 114, 115, 116 and 117 should acquire a digit result 120 corresponding to itself. Namely, the digit 111 acquires a digit result 121 corresponding to the digit 111, the digit 112 acquires a digit result 122 corresponding to the digit 112, the digit 113 acquires a digit result 123 corresponding to the digit 113, the digit 114 acquires a digit result 124 corresponding to the digit 114, the digit 115 acquires a digit result 125 corresponding to the digit 115, the digit 116 acquires a digit result 126 corresponding to the digit 116, the digit 117 acquires a digit result 127 corresponding to the digit 117, etc. To generalize, under a certain identification recipe a the digit 111 acquires a digit result 121α corresponding to the digit 111, the digit 112 acquires a digit result 122α corresponding to the digit 112, etc. After various identification recipes, each digit 111, 112, 113, 114, 115, 116 and 117 acquires various digit results 120 corresponding to itself.

Figure 3:
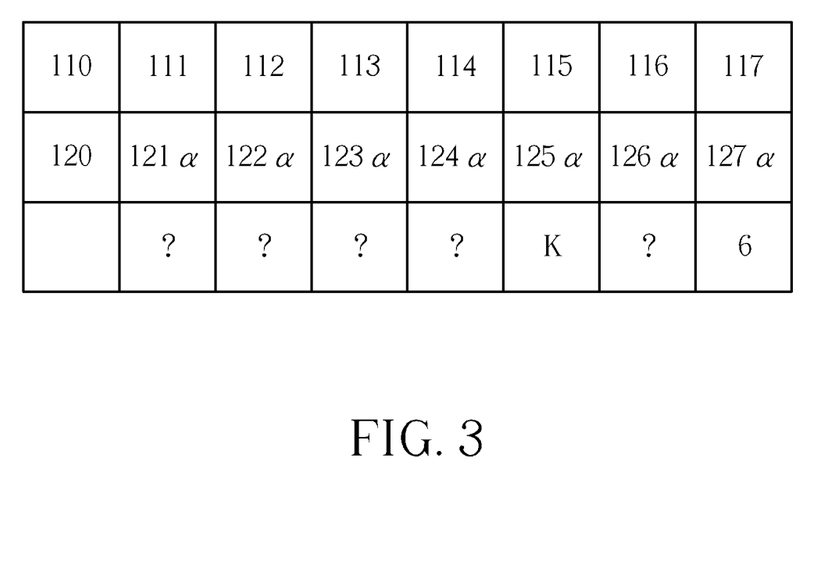

As shown in FIG. 3, under the first identification recipe α, every digit 111, 112, 113, 114, 115, 116 and 117 acquires a corresponding digit result corresponding to itself, namely 121α, 122α, 123α, 124α, 125α, 126α and 127α. For example, the digit result 121α, 122α, 123α, 124α, and 126α are all unsuccessful results "?". However, the digit result of 125α is a successful result "K" and the digit result of 127α is a successful result "6."

Figure 4:
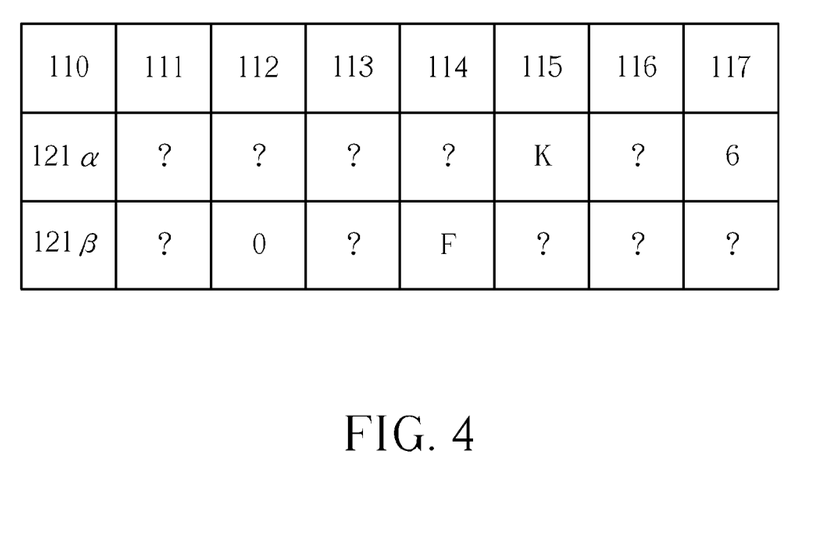

Next, as shown in FIG. 4, under the second identification recipe β, every digit 111, 112, 113, 114, 115, 116 and 117 acquires a corresponding digit result corresponding to itself, namely 121β, 122β, 123β, 124β, 125β, 126β and 127β. For example, the digit result 121β, 123β, 125β, 126β and 127β are all unsuccessful results "?" but the digit result of 122β is a successful result "O" and the digit result of 124β is a successful result "F". Please notice that any digit is considered to have a "permanent" successful reading once a successful result is obtained no matter whether a following successful result is obtained or not. In other words, now only the digit 111, 113 and 116 do not have a successful result.

Figure 5:
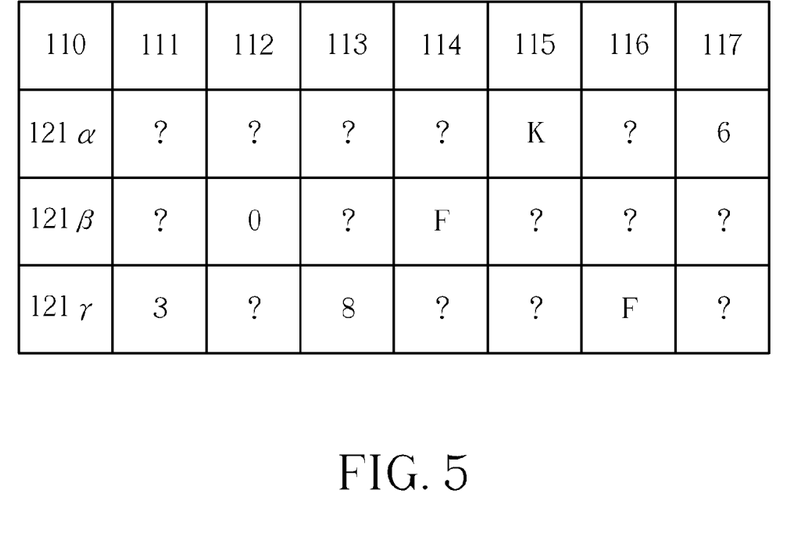

Afterwards, as shown in FIG. 5, under the third identification recipe γ, every digit 111, 112, 113, 114, 115, 116 and 117 acquires a corresponding digit result corresponding to itself, namely 121γ, 122γ, 123γ, 124γ, 125γ, 126γ and 127γ. Since only the digit 111, 113 and 116 have not respectively got a successful result yet, we may merely need to focus on the corresponding digit results of the three digits 111, 113 and 116. If, under the third identification recipe γ, the corresponding digit result for the 121γ is "3", for the 123γ is "8" and for the 126γ is "F". In the light of the above results, the wafer serial number 110 of the wafer 100 is 3-0-8-F-K-F-6.

Please notice that as far as the first identification recipe α, the second identification recipe β as well as the third identification recipe γ, none of a single identification recipe may identify all of the digits, 111, 112, 113, 114, 115, 116 and 117, in the wafer serial number 110 of the wafer 100 completely. If the conventional method is used, there is no valid wafer serial number can be obtained because none of a single identification recipe may identify all of the digits in the wafer serial number 110 of the wafer 100 completely, which results in abnormal reading of the wafer serial number. However, the method of the present invention may successfully resolve the problems because the gist of the present invention resides in the novel concept of "combination." Through combining the successful results of the independent digit results from every identification recipe all of the digits in the wafer serial number 110 of the wafer 100 can be completely acquired without being restricted to the fact that the digit results coming from each identification recipe very likely include at least one unsuccessful result. This breaks through the difficulty which the conventional method cannot cope with.

From another aspect, as far as any digit is concerned, the digit 111 for example, after the completion of the identification procedure including multiple identification recipes, all digit results 120, i.e. 121α, 121β, 121γ, concerning such digit are obtained. As long as the digit results 120 concerning one single digit includes at least one successful result, 121γ to be "3" for example, this digit is considered to be successfully identified no matter how many unsuccessful results come along with the successful result (s), for example 121α and 121β are all unsuccessful results. The wafer serial number 110 is deemed completely and successfully obtained if all the digits are successfully identified after all the identification recipes.

Generally speaking it is more likely to identify all the digits if one complete identification procedure includes more identification recipes. The advantages of the present invention lies in respectively obtaining the successful readings concerning every member under different identification recipes to more possibly identify the wafer serial number 110 of a wafer 100 successfully without being restricted to that all digits must be identified under one certain identification condition, that is one certain identification recipe. In other words, it is much less likely to fail to identify the wafer serial number 110 of a wafer 100.

Figure 6:
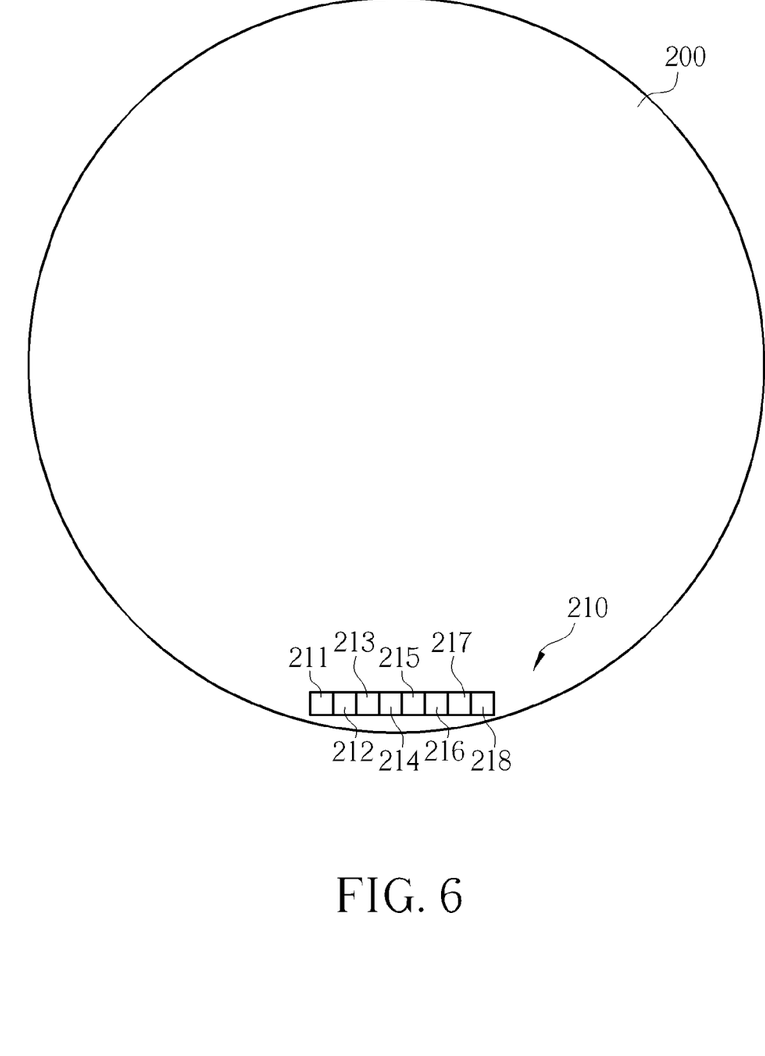
FIGS. 6-7 illustrate another example of the method for identifying a wafer serial number of the present invention.
Figure 7:
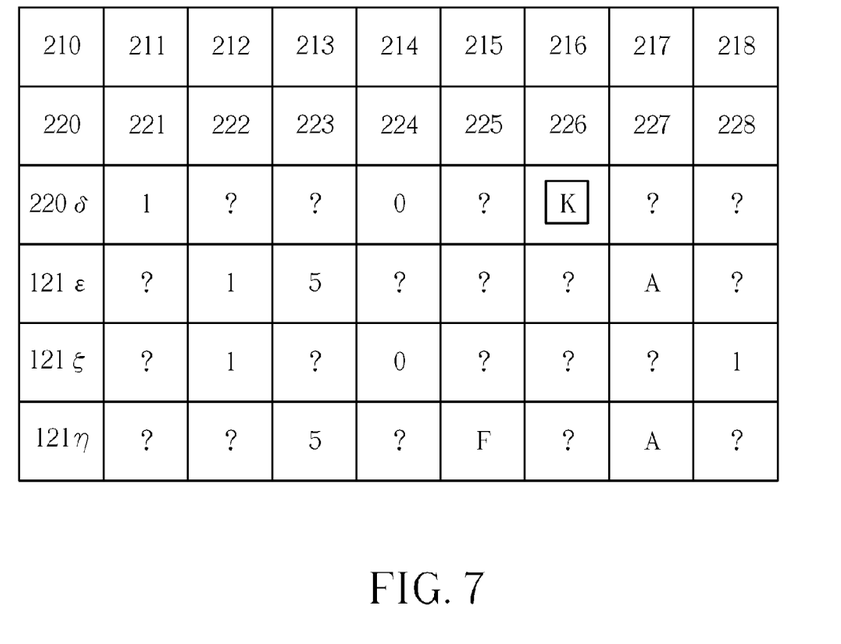

The present invention in another aspect also provides another method for identifying a wafer serial number. FIGS. 6-7 illustrate another example of the method for identifying a wafer serial number of the present invention. First, as shown in FIG. 6, a wafer 200 is provided. There is a wafer serial number 210 on the wafer 200. The wafer 200 may be a wafer 200 in a semiconductor process and is about to undergo various procedures, such as lithography, exposure, etching, cleaning, ion implantation, etc. The wafer serial number 210 is used to mark the wafer 200, like an ID number of a wafer. A wafer serial number 210 usually includes a plurality of digits. For example, a wafer serial number 210 usually includes 7-12 digits. Each digit may independently be any one of a character such as A, b, Γ or δ, a number from 0-9, a symbol such as #, %, £, a barcode or the combination.

Second, an identification procedure is carried out on the wafer 200. The identification procedure is used to identify every member of the digits in the wafer serial number 210 to determine an unknown wafer. An identification procedure usually includes multiple identification recipes. That is, multiple identification recipes are respectively employed one by one to identify every member of the digits in a given wafer serial number 210. After the identification procedure, multiple digit results 220 corresponding to every member of the digits in the wafer serial number 210 are collectively obtained.

The identification recipes may include various identification parameters, such as a light angle, a light intensity, a light direction, a light location, etc. Desirable identification recipes are formulated by changing and combining the various identification parameters. Usually a complete identification procedure includes 4-10 identification recipes.

For example, as shown in FIG. 6, assuming the wafer serial number 210 of a certain wafer 200 has 8 digits, i.e. there are 8 members, namely 211, 212, 213, 214, 215, 216, 217 and 218, in the wafer serial number 210. Every identification recipe is used to identify every digit, or called a member 211, 212, 213, 214, 215, 216, 217 and 218, in the wafer serial number 210 to determine an unknown serial number. Due to the intrinsic distinctions of every identification recipe, not every identification recipe may always completely identify every digit in the wafer serial number 210. Normally, each identification recipe identifies some digit or digits in the wafer serial number 210. The information with respect to every digit which is identified by a certain identification recipe in the wafer serial number 210 is called a "digit result" 220.

Generally speaking, a digit result 220 which corresponds to every digit 211, 212, 213, 214, 215, 216, 217 and 218 with respect to a certain identification recipe may be either one of three possible results, namely a successful result, a possible result and an unsuccessful result. Only one single digit result, that is, either a successful result, a possible result or an unsuccessful result, is obtained for a certain digit, member 211 for example, under a given identification recipe. In general, a read rate is used to judge if a digit result 220 belongs to a successful result, a possible result or an unsuccessful result.

Under a certain identification recipe, every digit should acquire a corresponding result. In other words, under any identification recipe, every digit 211, 212, 213, 214, 215, 216, 217 and 218 should acquire a digit result 220 corresponding to itself. Namely, the digit 211 acquires a digit result 221 corresponding to the digit 211, the digit 212 acquires a digit result 222 corresponding to the digit 212, the digit 213 acquires a digit result 223 corresponding to the digit 213, the digit 214 acquires a digit result 224 corresponding to the digit 214, the digit 215 acquires a digit result 225 corresponding to the digit 215, the digit 216 acquires a digit result 226 corresponding to the digit 216, the digit 217 acquires a digit result 227 corresponding to the digit 217, the digit 218 acquires a digit result 228 corresponding to the digit 218, etc. To generalize, under a certain identification recipe 6 the digit 211 acquires a digit result 221δ corresponding to the digit 211, the digit 212 acquires a digit result 222δ corresponding to the digit 212, etc. After various identification recipes, each digit 211, 212, 213, 214, 215, 216, 217 and 218 acquires various digit results 220 corresponding to itself.

As shown in FIG. 7, under the first identification recipe 6, every digit 211, 212, 213, 214, 215, 216, 217 and 218 acquires a corresponding digit result corresponding to itself, namely 221δ, 222δ, 223δ, 224δ, 225δ, 226δ, 227δ and 228δ. For example, the digit result 222δ, 223δ, 225δ, 227δ and 228δ are all unsuccessful results "?" but the digit result of 221δ is a successful result "1" and the digit result of 224δ is a successful result "0" and the digit result of 226δ is a possible result "$\boxed{K}$".

Under a second identification recipe ε, every digit 211, 212, 213, 214, 215, 216, 217 and 218 acquires a corresponding digit result 221ε, 222ε, 223ε, 224ε, 225ε, 226ε, 227ε and 228ε. Further, under a third identification recipe every digit 211, 212, 213, 214, 215, 216, 217 and 218 acquires a corresponding digit result 221ζ, 222ζ, 223ζ, 224ζ, 225ζ, 226ζ, 227ζ and 228ζ, and under a fourth identification recipe η, every digit 211, 212, 213, 214, 215, 216, 217 and 218 acquires a corresponding digit result 221η, 222η, 223η, 224η, 225η, 226η, 227η and 228η. Please refer to FIG. 7 for the identification results of a first identification recipe δ, a second identification recipe ε, a third identification recipe ζ and a fourth identification recipe η.

Some features can be observed from the illustrations of FIG. 7. First, any digit is considered to have a successful reading once a successful result is obtained no matter whether a following successful result is obtained or not. In other words, since the digit 211 acquires a digit result of 221δ, a successful result "1", under the first identification recipe δ, any following digit result does not matter any more. Second, through combining the successful results from every identification recipe all of the digits can be completely identified and the wafer serial number 210 of the wafer 200 is obtained when each digit obtains at least one successful result after all the identification recipes. Third, it is still possible to obtain the wafer serial number 210 of the wafer 200 if none of a digit has nothing but all unsuccessful results and at the same time the digit results of one or more digits are composed of possible results and unsuccessful results after all the identification recipes.

For example, the combination of the digit results of all digits in FIG. 7 may results in a possible wafer serial number 210 of the wafer 200 to read 1-1-5-0-F-$\boxed{K}$-A-1. Please notice that the wafer serial number 210 of the wafer 200 is likely to be 1-1-5-0-F-$\boxed{K}$-A-1 since the best digit result of the digit 226 is a possible result $\boxed{K}$.

In one embodiment of the present invention, if the wafer serial number 210 of the wafer 200 is determined to be "uncertain" and only one possible result is present, a check procedure is initiated. For example, a check formula is used to verify the possible wafer serial number and to further obtain a verified wafer serial number. For instance, if a possible wafer serial number passes a check formula, in other words the possible digit result $\boxed{K}$ passes the check formula, the wafer serial number 210 1-1-5-0-F-K-A-1 of the wafer 200 is verified to be true.

Figure 8:
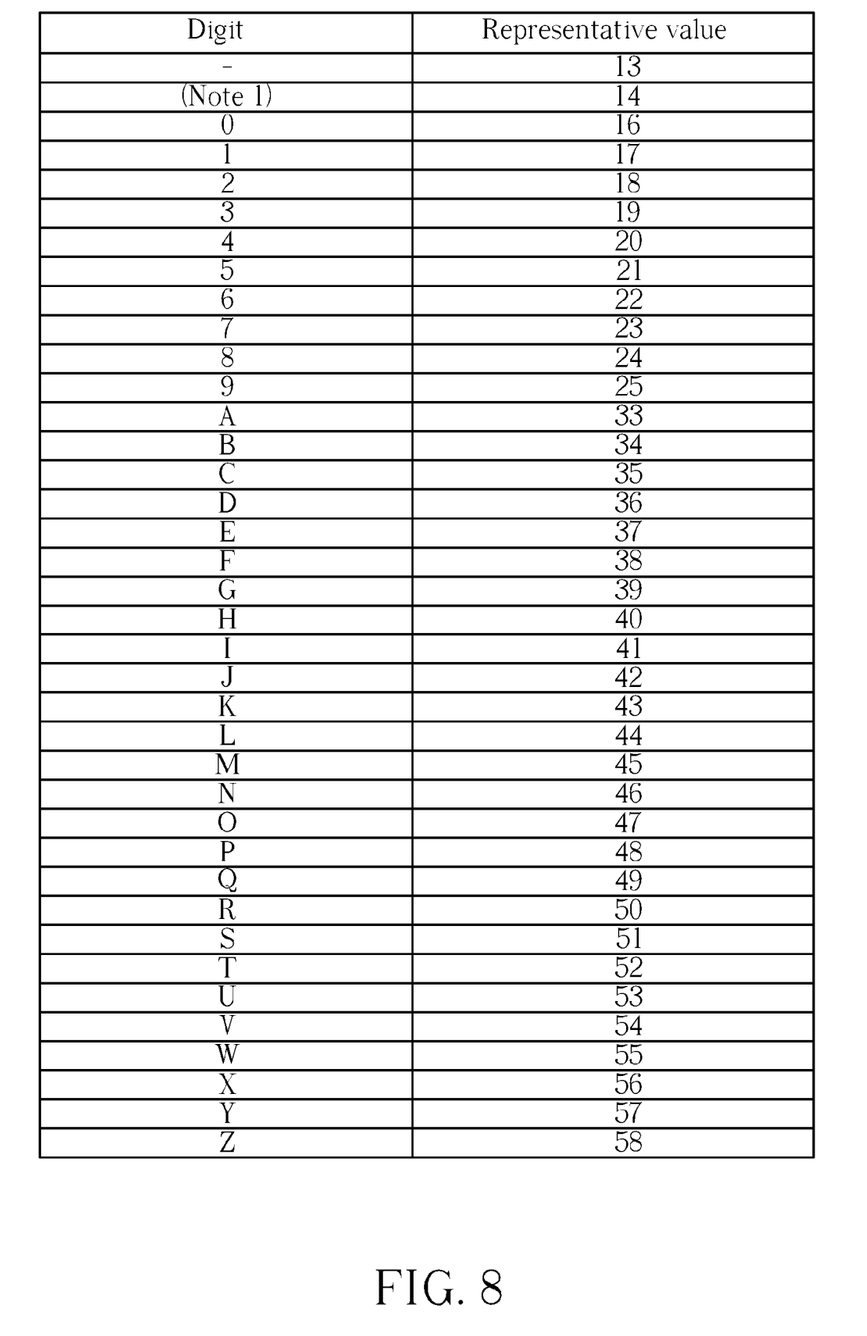
FIG. 8 illustrates an example of a reference of the representative value of each digit in the check formula.

An example is provided here to verify a wafer serial number 310 consisting of 12 digits by means of a check formula. The check formula shown here is:

$$8^{11}a_1+8^{10}a_2+8^9a_3+8^8a_4+8^7a_5+8^6a_6+8^5a_7+8^4a_8+8^3a_9+8^2a_{10}+8a_{11}+a_{12}$$

in which $a_1, a_2 \ldots a_{11}, a_{12}$ respectively represent the value of the first, the second... the eleventh and the twelfth digit of the wafer serial number 310. Please see FIG. 8 for the reference of the representative value of each digit in the check formula.

For instance, if 1-1-5-0-F-$\boxed{K}$-A-1 is needed to be verified to be a valid wafer serial number or not, the representative value of each digit from FIG. 8 is used in the check formula. If the sum can be divided by 59 with no remainder, the wafer serial number 1-1-5-0-F-K-A-1 of a wafer is verified to be valid. If not, the wafer serial number 1-1-5-0-F-K-A-1 of a wafer is verified to be invalid. In this example, the sum of the wafer serial number 310 8-3-4-E-1-1-5-0-F-K-A-1 can be divided by 59 with no remainder, the wafer serial number 310 8-3-4-E-1-1-5-0-F-K-A-1 is verified to be valid.

In another embodiment of the present invention, if the wafer serial number 210 of the wafer 200 is determined to be "uncertain" and the digit results of only one digit includes more than one possible result, a check procedure is initiated and a check formula is used. For instance, if the digit results of the digit 216 include two possible digit results, say $\boxed{K}$ and $\boxed{R}$ for example, and all others are unsuccessful results. The possible digit results $\boxed{K}$ and $\boxed{R}$ are subject to the check formula for verification. If one of the possible digit results passes the check formula, for example the possible digit result $\boxed{K}$ passes the check formula, the wafer serial number 210 1-1-5-0-F-K-A-1 of the wafer 200 is verified to be true.

In still another embodiment of the present invention, a combination procedure is initiated in advance to calculate all possible combinations of the digit results if the wafer serial number 210 of the wafer 200 is determined to be "uncertain" and the digit results of multiple digits include more than one possible result. For instance, if the digit results of the digit 215 include two possible digit results, say $\boxed{E}$ and $\boxed{F}$ for example, the digit results of the digit 216 include two possible digit results, say and $\boxed{K}$ for $\boxed{R}$ example, all other digit results of the digit 215 and 216 are unsuccessful results. After the combination procedure, all possible combinations of the digit results can be calculated, they are $\boxed{E}+\boxed{K}$, $\boxed{E}+\boxed{R}$, $\boxed{F}+\boxed{K}$ and $\boxed{F}+\boxed{R}$. Then, a check procedure is initiated and a check formula is used to repeatedly check all possible combinations of the digit results, here four possible results are shown. For example, if one of the possible results passes the check formula, the possible digit result $\boxed{F}+\boxed{K}$ for example passes the check formula, the wafer serial number 210 1-1-5-0-F-K-A-1 of the wafer 200 is verified to be true.

Moreover, if the possible digit results of one single digit are multiple and mutually different, a first combination procedure is initiated to optionally select the most possible one, that is, the digit result with the highest frequency. Further, if all possible results of the first combination procedure fail, a next combination procedure is later initiated to optionally select the second most possible one, that is, the digit result with the second highest frequency to be used in the check procedure.

Please notice that as far as the first identification recipe δ, the second identification recipe ε, third identification recipe ζ as well as the fourth identification recipe η are concerned, none of a single identification recipe may identify all of the digits, 211, 212, 213, 214, 215, 216, 217 and 218, in the wafer serial number 210 of the wafer 200 completely. If the conventional method is used, there is no valid wafer serial number that can be obtained because none of a single identification recipe may identify all of the digits in the wafer serial number 210 of the wafer 200 completely, which results in abnormal reading of the wafer serial number. However, the method of the present invention may successfully resolve the problems because the gist of the present invention resides in the novel concept of "combination." Even if the digit results of one or more digits have no successful result at all, it is still possible to obtain the wafer serial number 210 of the wafer 200 by means of the "combination procedure" and the "check procedure" as long as the digit results are not all unsuccessful results.

Those skilled in the art will readily observe that numerous modifications and alterations of the device and method may be made while retaining the teachings of the invention.

What is claimed is:

1. A method of identifying a wafer serial number, comprising:

providing a wafer having a wafer serial number thereon;
   performing an identification procedure on said wafer to
       identify said wafer serial number by means of multiple
       identification recipes, thereby obtaining multiple digit
       results which correspond to one specific digit in said wafer serial number under said multiple identification recipes, wherein said multiple digit results comprise at least two of a successful result and an unsuccessful result; and determining said wafer serial number in accordance with said multiple digit results; further comprising:

providing a combination procedure to calculate all possible combinations of said digit results when said digit results of said multiple digits comprise more than one possible result;

providing a check procedure;

performing said combination procedure to obtain a combination result, wherein said combination procedure is initiated when said multiple digit results of multiple said digits are composed of said possible result and said unsuccessful result, and the rest of said digits have at least one said successful result after said identification procedure; and performing said check procedure to repeatedly check said combination result.

2. The method of identifying a wafer serial number of claim 1, wherein said wafer serial number comprises 7-12 digits.

3. The method of identifying a wafer serial number of claim 1, wherein said wafer serial number comprises at least one of a character, a number and a symbol.

4. The method of identifying a wafer serial number of claim 1, wherein said identification recipe comprises at least one of a light angle, a light intensity, a light direction and a light location.

5. The method of identifying a wafer serial number of claim 1, wherein said identification procedure comprises 4-10 identification recipes.

6. The method of identifying a wafer serial number of claim 1, wherein said wafer serial number is obtained after every one of said digits goes through said identification procedure and gets at least one said successful result.

7. A method of identifying a wafer serial number, comprising:

providing a wafer having a wafer serial number thereon;

performing an identification procedure on said wafer to identify said wafer serial number by means of multiple identification recipes, thereby obtaining multiple digit results which correspond to one specific digit in said wafer serial number under the multiple identification recipes, wherein said multiple digit results comprise at least two of a successful result, a possible result and an unsuccessful result; and determining said wafer serial number in accordance with said multiple digit results; further comprising:

providing a combination procedure to calculate all possible combinations of said digit results when said digit results of said multiple digits comprise more than one possible result;

providing a check procedure;

performing said combination procedure to obtain a combination result, wherein said combination procedure is initiated when said multiple digit results of multiple said digits are composed of said possible result and said unsuccessful result, and the rest of said digits have at least one said successful result after said identification procedure; and performing said check procedure to repeatedly check said combination result.

8. The method of identifying a wafer serial number of claim 7, wherein said wafer serial number is obtained after every one of said digits goes through said identification procedure and gets at least one said successful result.

9. The method of identifying a wafer serial number of claim 7, further comprising:

providing a check procedure; and performing said check procedure to obtain said wafer serial number, wherein said check procedure is initiated when said multiple digit results of only one of said digit are composed of said possible result and said unsuccessful result, and the rest of said digits have at least one said successful result after said identification procedure.

10. The method of identifying a wafer serial number of claim 7, wherein said wafer serial number is obtained when said combination result passes said check procedure.

11. The method of identifying a wafer serial number of claim 7, wherein a first combination result is firstly obtained by means of choosing said possible result with the highest frequency.

12. The method of identifying a wafer serial number of claim 11, wherein a combination result is secondly obtained by means of choosing said possible result with the second highest frequency after said check procedure of the first combination result fails.

13. The method of identifying a wafer serial number of claim 7, wherein said combination procedure calculates all possible combination results of all said digits.

14. The method of identifying a wafer serial number of claim 7, wherein said wafer serial number comprises 7-12 digits.

15. The method of identifying a wafer serial number of claim 7, wherein said wafer serial number comprises at least one of a character, a number and a symbol.

16. The method of identifying a wafer serial number of claim 7, wherein said identification recipe comprises at least one of a light angle, a light intensity, a light direction and a light location.

17. The method of identifying a wafer serial number of claim 7, wherein said identification procedure comprises 4-10 identification recipes.

* * * * *